PHASE SHIFT OSCILLATOR WITH ERROR CORRECTOR

Filed Feb. 1, 1967 2 Sheets-Sheet 1

INVENTOR.
PETER L. RICHMAN
BY
Arnold & Roylance
ATTORNEYS

PHASE SHIFT OSCILLATOR WITH ERROR CORRECTOR

Filed Feb. 1, 1967 2 Sheets-Sheet 2

INVENTOR
PETER L. RICHMAN

BY Arnold & Roylance
ATTORNEYS

United States Patent Office 3,396,346

Patented Aug. 6, 1968

3,396,346

PHASE SHIFT OSCILLATOR WITH ERROR CORRECTOR

Peter L. Richman, Lexington, Mass., assignor to Weston Instruments, Inc., Newark, N.J., a corporation of Delaware Filed Feb. 1, 1967, Ser. No. 613,191
8 Claims. (Cl. 331—135)

ABSTRACT OF THE DISCLOSURE

A closed loop dual integrator-inverter oscillator circuit is provided with a forward-feed circuit which includes an operational amplifier and which amplifies and shifts the phase of an error signal the proper amount to reduce the loop error to zero. In one embodiment the forward-feed circuit is connected between the summing junction of the first integrator circuit and the input of the inverter circuit. In another embodiment two forward feed circuits are provided, one connected in parallel circuit relationship with each integrator circuit.

This invention relates to oscillators, and more specifically to oscillator circuits including circuit means for controlling the amplitude of the oscillator output signal.

In the prior art, oscillators of the phase shift type are well known, especially those of the type including two integrator circuits and an inverting operational amplifier, all connected in series circuit relationship in a closed loop. In these prior art circuits, each integrator circuit generally includes an amplifier having very high gain and a capacitor connected between the input and output terminals of the amplifier, in the manner of an operational amplifier. Each integrator circuit is assumed to cause a 90° phase shift in the signal being amplified, the total phase shift introduced by both integrators then being 180°. The inverting amplifier, which is generally an operational amplifier with resistive feedback, causes an additional 180° phase shift. Thus, when these three basic components are connected in a closed loop, the total loop phase shift is 360° or 0° and oscillation is sustained.

The above discussion is based on the assumption that the theoretical 90° phase shift is attained in each integrator amplifier. However, a full 90° phase shift is obtained in a unity gain integrator only when the open loop gain of the amplifier in the integrator is infinite. Obviously, no practical amplifier exhibits truly infinite gain. With an amplifier of high but finite gain, the integrator exhibits a phase error (an amount by which the overall integrator phase shift differs from 90°) which is an inverse function of gain. A more complete discussion of this aspect of integrators is found in the text entitled Electronic Analog Computers, by Korn and Korn, second edition, 1956, published by McGraw-Hill Book Company, New York, especially at page 180.

From the above it will be seen that a practical double integrator-inverter oscillator develops something different from 360° loop phase shift, and that the amplitude of the output signal is therefore subject to variations. At a preselected signal design frequency, the integrator circuits can be designed so that the loop phase error is negligible and so that the oscillator will perform its intended function.

However, it will be recognized that it may be desirable to use this basic oscillator circuit arrangement as a variable frequency oscillator by making the frequency determining elements in the circuit variable. In particular, it is frequently advantageous to insert variable resistors in the circuit means interconnecting the integrators and the inverter in the closed loop. Alternatively, an attenuator such as a potentiometer can be inserted between the input to the integrator and the integrator itself to effect frequency control. Either alternative introduces an additional problem, however, since the integrators and the inverter do not generally exhibit constant gain over the desired bandwidth. If the gain of an amplifier changes, the phase shift of the stage also changes, so that the amplitude of the output signal is a function of frequency. This disadvantage is particularly important when the oscillator is of instrument quality, with the desired frequency range relatively broad and the frequency response requirements high.

An object of the present invention is to provide an oscillator apparatus having a loop gain correcting circuit to provide close control of the output signal characteristics.

Another object is to provide a dual integrator-inverter oscillator apparatus having circuit means for correcting phase shift error in the oscillator loop.

Briefly stated, the invention provides a dual integrator-inverter oscillator wherein at least one amplifier circuit is connected between an integrator circuit input terminal and the inverter circuit terminal to deliver to the inverter a signal which is of the proper gain and phase relation to oppose the error signal normally developed by integrator circuits including amplifiers having finite gain characteristics. In one embodiment of the invention, a network is added between the input terminal of the first of two series-connected integrator circuits and the input of the inverter circuit, the additional network including an operational amplifier having an overall gain of 2 and a phase shift of 180°, this amplifier being adapted to multiply the error signal by two and invert that signal so as to correct for the phase error of the integrator circuits. In a second embodiment the correction circuit gain is varied with the frequency adjustments. In another embodiment, each integrator circuit of the oscillator is provided with an integrator circuit in parallel with the first, the loop amplification characteristics of each of these additional networks being adjusted to correct for the integrator phase error.

In order that the manner in which the foregoing and other objects are attained in accordance with the invention can be understood in detail, particularly advantageous embodiments thereof will be described with reference to the accompanying drawings, which form a part of this specification, and wherein.

Figure 1:
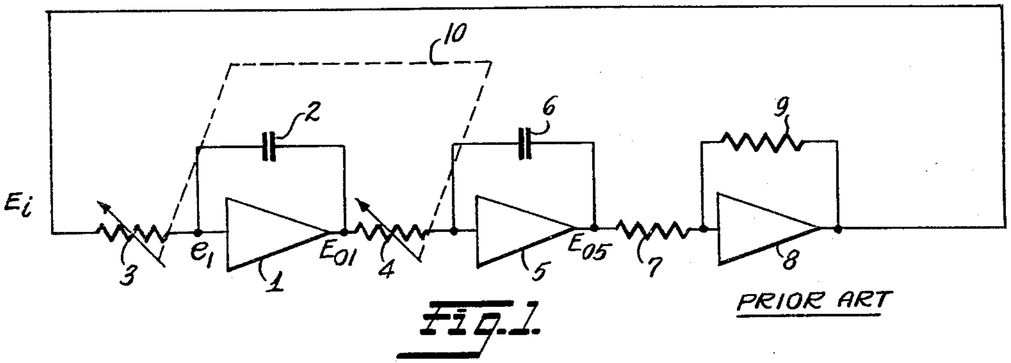
PRIOR ART FIG. 1.
FIG. 1 is a schematic diagram of a prior art oscillator.

Referring to FIG. 1, it will be seen that the basic dual integrator oscillator includes a conventional high gain amplifier 1 having a capacitor 2 connected between the input and output terminals of the amplifier. A variable input resistor or rheostat 3 is connected to the input terminal of the amplifier, the amplifier, capacitor, and resistor forming a conventional integrator circuit. A variable resistor or rheostat is connected between the output terminal of amplifier 1 and the input terminal of a conventional high gain amplifier 5. A capacitor 6 is connected between the input and output terminals of amplifier 5 to form a second integrator circuit. A resistor 7 is connected between the output terminal of amplifier 5 and the input terminal of a conventional high gain amplifier 8, the output terminal of which is connected to the other terminal of resistor 3. A feedback resistor 9 is connected between the input and output terminals of amplifier 8 to form an inverting operational amplifier. The movable elements of variable resistors 3 and 4 are advantageously mechanically coupled together as indicated by dashed line 10.

In order to fully understand the operation of the invention, it will be helpful to consider a brief analysis of the circuit of FIG. 1. The voltages appearing at various points in the circuit of FIG. 1 are identified as follows: $E_i$ is the signal into resistor 3, the input resistor of the first integrator; $e_1$ is the error signal appearing at the input terminal of amplifier 1; $E_{O1}$ is the signal at the output of amplifier 1; and $E_{O5}$ is the signal at the output of amplifier 5.

From FIG. 1, it will be seen that $$\frac{E_i-e_1}{R}+\frac{E_{O1}-e_1}{\frac{1}{pC}}=0 \qquad (1)$$

where R is the value of resistor 3, C is the value of capacitor 2, and $p$ is used as the complex radian frequency coefficient $j\omega$. Equation 1 merely states that the current through the input resistor and feedback capacitor are equal in magnitude and opposite in direction.

Also, it will be seen that $$e_1=-\frac{E_{O1}}{A_1} \qquad (2)$$

where $A_1$ is the open-loop gain of amplifier 1.

Substituting (2) in (1), $$\frac{E_i}{R}+\frac{E_{O1}}{A_1R}+pCE_{O1}+\frac{E_{O1}}{A_1}pC=0 \qquad (3)$$

Solving (3) for the total stage complex gain, $$\frac{E_{O1}}{E_i}=\frac{-\frac{1}{pRC}}{1+\frac{1}{A_1}+\frac{1}{A_1pRC}} \qquad (4)$$

Equation 4 can be restated as an approximate equation by dividing the denominator into 1 and eliminating second order components, i.e., $$\frac{E_{O1}}{E_i}\cong-\frac{1}{pRC}\left[1-\frac{1}{A_1}-\frac{1}{A_1pRC}\right] \qquad (4a)$$

Now, substituting $p=j\omega$ and, at a loop oscillating frequency letting $\omega RC=1$, $$\frac{E_{O1}}{E_i}\cong j\left[1-\frac{1}{A_1}\right]-\frac{1}{A_1} \qquad (5)$$

Assuming that the gain of amplifier 1 is equal to the gain of amplifier 5 and that both are equal to A, we can solve for the output $E_{O5}$ by squaring (5), so that $$\frac{E_{O5}}{E_i}\cong\left(j\left[1-\frac{1}{A}\right]-\frac{1}{A}\right)^2 \qquad (6)$$

By expanding this expression and by eliminating terms which are negligibly small, as well as in-phase components which have no significance for purposes of the present discussion, we see that $$\frac{E_{O5}}{E_i}\cong-1-\frac{2j}{A} \qquad (7)$$

This expression shows that the two-stage gain involves unity gain plus an error term equal to $$\left(-\frac{2j}{A}\right)$$

However, it will be observed that the error $e_1$, from Equations 2 and 5, is given by:

$$\frac{e_1}{E_i}\cong-\frac{1}{A}\left(j\left[1-\frac{1}{A}\right]-\frac{1}{A}\right) \qquad (8)$$

again letting the stage gains be equal to each other and to A. Ignoring second order infinitesimals and inphase components, this becomes $$\frac{e_1}{E_i}\cong-\frac{j}{A} \qquad (9)$$

Now it can be seen that the error at the input to amplifier 1 as shown in Equation 9 is equal to ½ of the error term at the output of amplifier 5 as shown in Equation 7.

Figure 2:
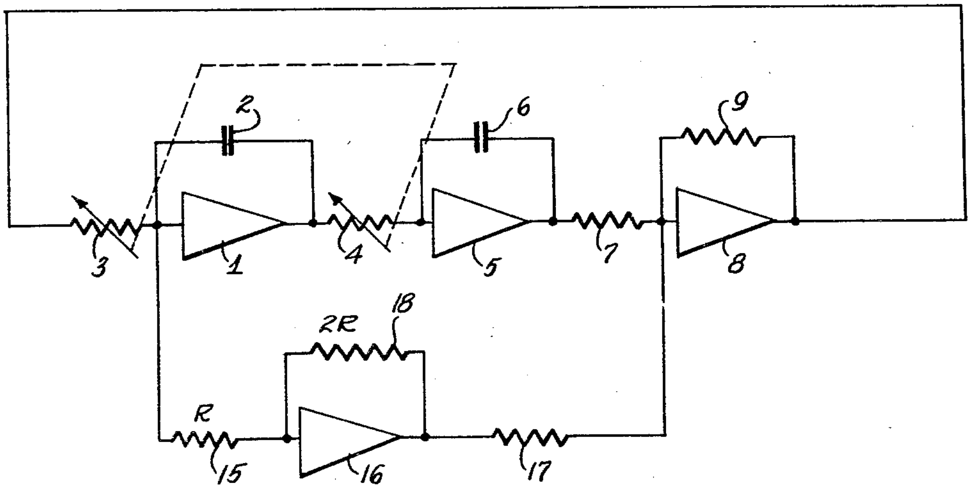
FIG. 2 is a schematic diagram of an oscillator circuit in accordance with one embodiment of the invention.

To eliminate this error component in accordance with the invention, an additional network is inserted as shown in FIG. 2, wherein components which are the same as those in FIG. 1 are identified by like reference numerals, including amplifiers 1, 5 and 8, capacitors 2 and 6, and resistors 3, 4, 7 and 9. Again, the movable contacts of resistors 3 and 4 are advantageously mechanically coupled together so that adjustment of these two resistors varies the frequency of the loop and causes the characteristics of the two integrators to be modified in the same direction and by the same amount.

The compensating network includes a fixed resistor 15, one terminal of which is connected to the input terminal of amplifier 1 and the other terminal of which is connected to the input terminal of a conventional high gain amplifier 16. The output terminal of amplifier 16 is connected to one terminal of a fixed resistor 17, the other terminal of which is connected to the input terminal of amplifier 8. A fixed resistor 18 is connected between the input and output terminals of amplifier 16 forming an inverting operational amplifier.

As will be recognized by those skilled in the art, the overall amplification factor of the inverting amplifier stage including amplifier 16 can be adjusted by selection of the relative values of resistors 18 and 15. In accordance with the present invention, the overall gain of that stage is normally established at two by selecting the value of resistor 18 to be twice that of resistor 15. In this manner, the error signal appearing at the input to terminal 1, and as shown in Equation 9, is inverted and multiplied by two and is added to the signal appearing at the input to amplifier 8 at the summing junction formed by resistors 7, 9 and 17. Resistors 7 and 17 should be equal in value. The error signal is then combined with the error signal component expressed in Equation 7 (the output of amplifier 5) and cancels that error term. Thus, the signal provided to amplifier 8 includes only the in-phase components which are shifted in phase by the inverter circuit including amplifier 8 and are fed back through resistors 10 and 3 to the input terminal of amplifier 1.

Figure 3:
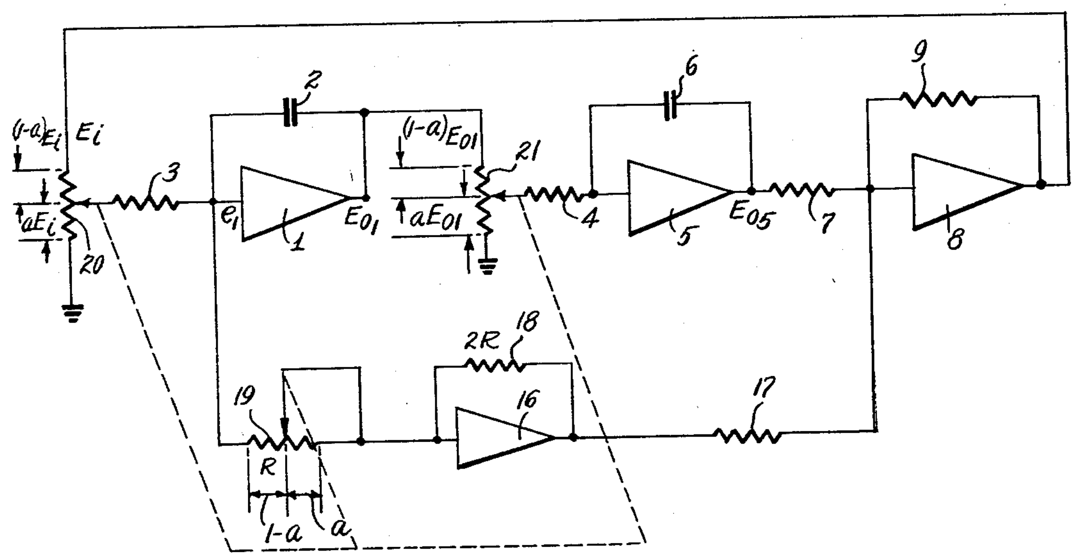
FIG. 3 is a schematic diagram of an oscillator circuit in accordance with a second embodiment of the invention.

Another embodiment of the invention is shown in FIG. 3. The basic oscillator circuit shown in FIG. 3 again includes amplifiers 1, 5 and 8 with feedback capacitors 2 and 6 connected in parallel with amplifiers 1 and 5, respectively, to form integrator circuits, and with resistor 9 connected in parallel with amplifier 8 to form an inverter circuit. Also in the circuits of FIGS. 1 and 2 input resistors 3, 4 and 7 are connected to the input terminals of the three amplifiers. However, in the circuit of FIG. 3, the variation in frequency is obtained by using potentiometers rather than the rheostats of FIGS. 1 and 2. In FIG. 3, resistors 3 and 4 are fixed resistors, the variation in attenuation in the input circuit to amplifier 1 being provided by a potentiometer 20, the resistive element of which is connected between the output of amplifier 8 and ground and the slider of which is connected to input resistor 3. Also, at the output of amplifier 1 a potentiometer 21 is connected between ground and the output terminal of amplifier 1. The movable contact of potentiometer 21 is connected to input resistor 4. The movable elements of potentiometers 20 and 21 are mechanically coupled together as are the rheostats in the circuits of FIGS. 1 and 2.

The incorporation of potentiometers rather than the rheostats of the previously discussed embodiment raises a new problem which is not adequately solved by the compensation circuit of FIG. 2. This problem arises from the fact that the potentiometers act as voltage dividers and that the ratio of each potentiometer setting has a distinct effect upon the voltage delivered to each stage. It will be recognized that the frequency of oscillation of the apparatus of FIG. 3 is determined by the potentiometer setting, and it follows that within the range of resistance variation of each potentiometer there is a frequency associated with each particular division ratio. Also, it will be apparent that with the potentiometer movable contact moved to its largest division ratio, i.e., with the movable contacts moved to the top of the potentiometers as shown in FIG. 3, the frequency will be at a maximum. This maximum frequency will be identified herein as $\omega_m$.

Further, it will be recognized that the voltage delivered to the input sides of resistors 3 and 4 can be represented as $aE_i$, and $aE_{O1}$, respectively, where $a$ is the fraction of the potentiometer resistance between the movable element and ground. The voltage appearing across the upper portion of the potentiometer between the output of the preceding amplifier and the movable element will then be equal to $(1-a)E_i$ and $(1-a)E_{O1}$, respectively.

Defining again the output signal from amplifier 1 as $E_{O1}$ and the input error voltage to amplifier 1 as $e_1$, Equation 4*a* can be applied to FIG. 3 as $$\frac{E_{O1}}{aE_i} \cong -\frac{1}{j\omega RC}\left[1-\frac{1}{A_1}-\frac{1}{A_1 j\omega RC}\right] \quad (10)$$

Because the ratio of the actual frequency setting $\omega$ of potentiometer 20 to the maximum frequency setting $\omega_m$ of the potentiometer is necessarily the same as the factor by which $E_i$ is multiplied, $$a=\omega/\omega_m \quad (11)$$

Substituting (11) in (10), and letting $\omega_m RC=1$, $$\frac{E_{O1}}{E_i} \cong j\left[1-\frac{1}{A_1}\right]-\frac{\omega_m}{A_1\omega} \quad (12)$$

so that, from (2) and (12), $$\frac{e_1}{E_i} \cong -\frac{j}{A_1} \quad (13)$$

Squaring (12) to obtain $E_{O5}/E_i$, as before at (6), and again ignoring second order terms, the output of amplifier 5 assuming again that the gain of amplifier 5 is equal to the gain of amplifier 1 and that both are equal to A, is:

$$\frac{E_{O5}}{E_i} = -1+\frac{2}{A}-\frac{2j}{A}\frac{\omega_m}{\omega} \quad (14)$$

in which $2/A$ can be ignored because it involves only loop gain and not phase shift. The error at the output of amplifier 5 is therefore $$\frac{E_{O5}}{E_i} \cong -1-\frac{2j}{A}\frac{\omega_m}{\omega} \quad (15)$$

Equation 15 emphasizes the fact that the error at the second integrator output, using voltage divider frequency adjusting potentiometers, is frequency dependent, but the error at $e_1/E_i$ is not, as seen at Equation 13.

Figure 4:
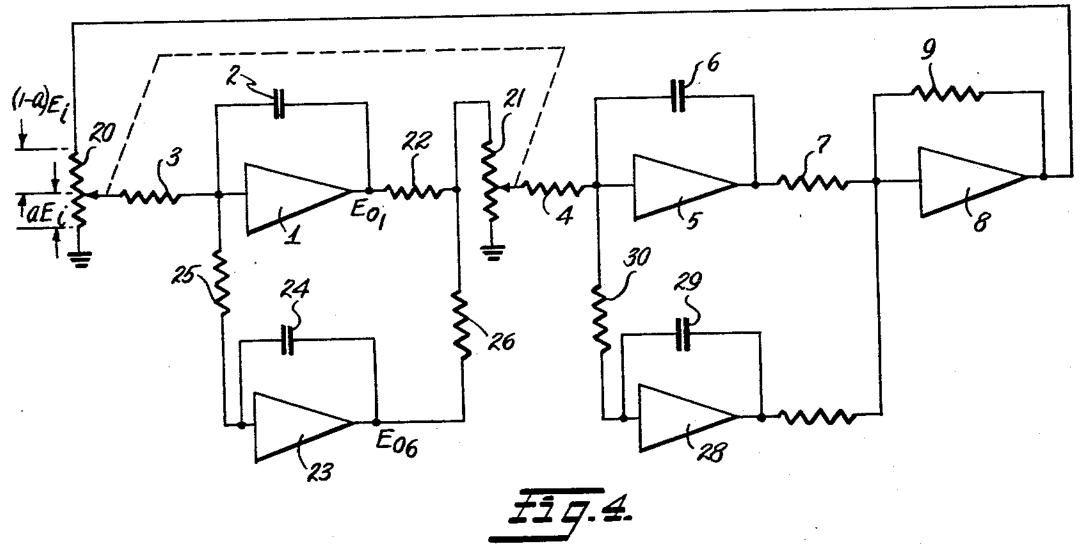
FIG. 4 is a schematic diagram of an oscillator circuit in accordance with a third embodiment of the invention.

Two practical solutions to this mathematical problem, in accordance with the invention, are shown in FIGS. 3 and 4. In FIG. 3, the basic oscillator circuit for which performance was described above, the compensating circuit includes an amplifier 16 with a feedback resistor 18 and a variable value input resistance 19. A summing resistor 17 connects the output of amplifier 16 to the summing junction at the input of amplifier 8. Resistor 18 is advantageously twice the value of the maximum value of resistor 19, and resistor 17 is advantageously equal to resistor 7. However, the movable contact of resistor 19 is mechanically coupled to the movable contacts of potentiometers 20 and 21 so that the overall gain of the error correcting circuit is varied with variations in the oscillator frequency. This variation is necessary to render the correction signal summed at the summing junction formed by resistors 7 and 17 consistent with the frequency dependence of the error signal shown in Equation 15.

In FIG. 4, a first compensating network is connected across the integrator circuit including amplifier 1. This network includes a conventional high gain amplifier 23 and a capacitor 24 equal to capacitors 2 and 6 connected between the input and output terminals of amplifier 23 to form an integrator circuit. An input resistor 25 equal to resistors 3 and 4 is connected between the input terminals of amplifiers 1 and 23. A fixed resistor 26 equal to resistor 22 is connected between the output terminal of amplifier 23 and the junction between resistor 22 and potentiometer 21. The ratio of resistors 9 and 7 is adjusted to restore total loop gain to unity in spite of the attenuation caused by the divider composed of resistors 22, 26 and potentiometer 21.

It will be recognized from the above analysis that the signal $E_{O6}$ at the output of amplifier 23 is given by $$\frac{E_{O6}}{E_i} = \left(-\frac{j}{A_1}\right)\left(j\frac{\omega_m}{\omega}\right) = \frac{1}{A_1}\frac{\omega_m}{\omega} \quad (16)$$

in terms of Equation 13 and the gain of integrators 25–23–24, $$\left(j\frac{\omega_m}{\omega}\right)$$

$E_{O6}$ is summed with the signal from amplifier 1 by the summing junction including resistors 22 and 26 and which compensates for the real portion of the error signal appear at that point, given by the last term of Equation 12.

A similar network is connected around the integrator including amplifier 5, the network including a conventional high gain amplifier 28 and a feedback capacitor 29 connected between the input and output terminals of that amplifier. An input resistor 30 is connected between the input terminals of amplifiers 28 and 5, and a summing resistor is connected between the output terminal of amplifier 28 and the input terminal of amplifier 8.

This second network compensates for the phase error of the second integrator circuit in the same manner as was described with reference to the first integrator. No detailed discussion of the operation thereof is therefore necessary.

While certain advantageous embodiments have been chosen to illustrate the invention, it will be understood by those skilled in the art that various changes and modifications can be made therein without departing from the scope of the invention as defined in the appended claims.

What is claimed is:

1. An apparatus for generating electrical oscillations of variable frequency comprising the combination of first integrator circuit means including a first high gain amplifier having an input terminal and an output terminal, an input resistor, and a capacitor connected between said input and output terminals for shifting the phase of electrical signals applied to said input resistor by approximately 90°; second integrator circuit means including a second high gain amplifier having an input terminal and an output terminal, a second input resistor, and a capacitor connected between said input and output terminals for shifting the phase of electrical signals applied to said second input resistor by approximately 90°; inverter circuit means including a third high gain amplifier having an input terminal and an output terminal, a third input resistor, and a feedback resistor connected between said input and output terminals for inverting the phase of electrical signals applied to said third input resistor; circuit means for interconnecting said first and second integrator circuit means and said inverter circuit means in series circuit relationship in a regenerative closed loop, said circuit means including at least one variable resistance in the input circuit to at least one of said integrator circuit means; and error correcting network means for accepting a loop phase error signal from the input terminal of said first amplifier and for providing a corrective signal to said input terminal of said third amplifier, said corrective signal being shifted in phase by an amount equal and opposite to the undesired phase shift accomplished by the intervening loop portion.

2. An apparatus according to claim 1 wherein said error correcting network means comprises a fourth high gain amplifier having an input terminal and an output terminal; a feedback resistor connected between the input and output terminals of said fourth amplifier; an input resistor connected between the input terminals of said first amplifier and said fourth amplifier; and a summing resistor connected between said output terminal of said fourth amplifier and said input terminal of said third amplifier, said error correcting network being operative to shift the phase of the signal supplied thereto by 180°.

3. Apparatus according to claim 1 wherein said error correcting network means comprises a first forward-feed network comprising a fourth amplifier, a capacitor connected in parallel circuit relationship with said fourth amplifier and input and output resistors connected to the input and output terminals respectively of said fourth amplifier, said first network being connected between said input terminal of said first amplifier and said circuit means interconnecting said first and second integrator circuit means; and a second forward-feed network comprising a fifth amplifier, a capacitor connected in parallel circuit relationship with said fifth amplifier and input and output resistors connected to the input and output terminals respectively of said fifth amplifier, said second network being connected between the summing junctions of said second and third amplifiers.

4. In an oscillator apparatus of the type including first and second integrator circuits and an inverter circuit connected in series closed loop relationship, a potentiometer interconnecting the two integrator circuits and a potentiometer interconnecting the inverter and the first integrator circuit, the improvement comprising compensating network means comprising a high gain amplifier having an input terminal and an output terminal; a feedback resistor connected between said input and output terminals; a resistor connected between said output terminal of said amplifier and the summing junction at the input of the inverter circuit amplifier; and a variable input resistor interconnecting the summing junction at the input of the first integrator circuit amplifier and said input terminal of said high gain amplifier, the movable elements of the potentiometer and said variable input resistor being mechanically coupled for movement together.

5. An apparatus according to claim 4 wherein the value of said feedback resistor is approximately twice the maximum value of said variable input resistor.

6. In an oscillator apparatus of the type including first and second integrator circuits and an inverter circuit connected in series closed loop relationship, a first potentiometer interconnecting the two integrator circuits and a second potentiometer interconnecting the inverter circuit and the first integrator circuit, the improvement comprising first and second compensating network means each comprising a high gain amplifier having an input terminal and an output terminal; an input resistor connected to said input terminal; an output resistor connected to said output terminal; and a feedback capacitor connected between said input and output terminals; said first compensating network being connected between the input summing junction of the first integrator circuit and the first potentiometer; said second compensating network being connected between the input summing junctions of the second integrator circuit and the input summing junction of the inverter circuit.

7. In an oscillator apparatus of the type including first and second integrator circuits and an inverter circuit connected in regenerative closed loop relationship, the input resistors for the first and second integrator circuits including first and second variable resistors, the improvement comprising compensating network means comprising a high gain amplifier having an input terminal and an output terminal; a feedback resistor connected between said input and output terminals; a resistor connected between said output terminal of said amplifier and the summing junction at the input of the inverter circuit amplifier; and a fixed input resistor interconnecting the summing junction at the input of the first integrator circuit amplifier and said input terminal of said high gain ampilfier.

8. An apparatus according to claim 7 wherein the resistance of said feedback resistor is twice the resistance of said fixed input resistor.

References Cited

Electronics Design, Feb. 1, 1965, p. 24.

Paul et al., "Measurement of Phase and Amplitude at Low Frequencies," Electronic Engineering, March 1959, pp. 142–144.

ROY LAKE, *Primary Examiner.*

S. H. GRIMM, *Assistant Examiner.*

Disclaimer and Dedication

3,396,346.—*Peter L. Richman*, Lexington, Mass. PHASE SHIFT OSCILLATOR WITH ERROR CORRECTOR. Patent dated Aug. 6, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]